United States Patent [19]

Temple

[11] Patent Number: 5,777,346

[45] Date of Patent: Jul. 7, 1998

[54] METAL OXIDE SEMICONDUCTOR CONTROLLED THYRISTOR WITH AN ON-FIELD EFFECT TRANSISTOR IN A TRENCH

[75] Inventor: Victor Albert Keith Temple, Clifton Park, N.Y.

[73] Assignee: Harris Corporation, Palm Bay, Fla.

[21] Appl. No.: 586,613

[22] Filed: Jan. 16, 1996

[51] Int. Cl.$^6$ .................................................. H01L 29/74
[52] U.S. Cl. .......................... 257/120; 257/107; 257/119; 438/133; 438/137
[58] Field of Search ................................. 257/110, 107, 257/119, 120, 124, 128, 135, 167, 170; 438/133, 137

[56] References Cited

PUBLICATIONS

Syau et al., Comparison of Ultralow Specific On–Res–U-MOSFET Structures: The ACCUFET, EXTFET, INFET, and conventional UMOSFET's, May 1994; IEEE Transactions on Electron Devices, vol. 41, No. 5, pp. 800–808.

Primary Examiner—Jerome Jackson
Assistant Examiner—Nathan K. Kelley
Attorney, Agent, or Firm—Jaeckle Fleischmann & Mugel, LLP

[57] ABSTRACT

One embodiment of a metal oxide semiconductor controlled thyristor in accordance with the present invention has a semiconductor wafer with opposing first and second surfaces. The wafer includes first through sixth sequential regions which are disposed one above the other. The first region includes the second surface of the wafer and each of the second through sixth regions has at least a portion which extends up to the first surface. The first, third, and sixth regions have a first type of conductivity and the second, fourth, and fifth regions have a second type of conductivity. A trench with a bottom and sidewalls extends from the first surface and passes through the fourth, fifth, and sixth regions and into the third region. A dielectric material coats the bottom and sidewalls of the trench and a conductive material fills the remainder of the trench. In an alternative embodiment: the third through sixth regions have at least a portion which extends up to the first surface; the first, fourth, and sixth regions have a first type of conductivity; the second, third, and fifth regions have a second type of conductivity; and the trench extends from the first surface and passes through the fifth and sixth regions and into the fourth region.

54 Claims, 5 Drawing Sheets

METAL OXIDE SEMICONDUCTOR CONTROLLED THYRISTOR WITH AN ON-FIELD EFFECT TRANSISTOR IN A TRENCH

FIELD OF THE INVENTION

This invention relates generally to a metal oxide semiconductor controlled thyristor (MCT) and, more particularly, relates to an MCT with an On-Field Effect Transistor (On-FET) in a trench.

BACKGROUND OF THE INVENTION

A prior art P type metal oxide semiconductor controlled thyristor (MCT) 10 is illustrated in FIG. 1. The MCT 10 includes a PNP transistor 12, an NPN transistor 14, an N channel Off-FET 16, and a P channel On-FET 18. The gates G1 and G2 of Off-FET 16 and the On-FET 18 are coupled together. The upper emitter UE of PNP transistor 12 is coupled to an anode A and to the source S1 of Off-FET 16 and to the source S2 of On-FET 18. The upper base UB of PNP transistor 12 is coupled to drain D1 of Off-FET 16 and to lower collector LC of NPN transistor 14. The upper collector UC of PNP transistor 12 is coupled to drain D2 of On-FET 18 and to lower base LB of NPN transistor 14. The lower emitter LE of NPN transistor 14 is coupled to a cathode C.

The P type MCT 10 shown in FIG. 1 operates in one of two states: on or off. P type MCT 10 is turned on when a voltage more negative than the On-FET threshold voltage is input at gates G1 and G2. This voltage causes On-FET 18 to turn on which provides a current to lower base LB of NPN transistor 14 turning NPN transistor 14 on. Once NPN transistor 14 is on, lower collector LC of NPN transistor 14 draws current from upper base UB for PNP transistor 12 turning PNP transistor 12 on. The P type MCT 10 is turned off when a voltage more positive than the Off-FET threshold voltage is input at gates G1 and G2 as described in Harris MCT User's Guide (Harris DB307A) which is herein incorporated by reference. The positive voltage causes Off-FET 16 to turn on which shorts out upper emitter UE to upper base UB turning off PNP transistor 12 which turns off NPN transistor 14. One example of an MCT is disclosed in U.S. Pat. No. 4,816,892 to Temple, which is herein incorporated by reference.

One area of current research with MCTs, such as the P type MCT described above, is in exploring ways in which the cell density of MCTs can be increased. When cell density of MCTs is increased, then more current can be controlled. One way of increasing cell density is to dispose Off-FETs in trenches. Disposing the Off-FET in a trench does not pose many problems. As shown in FIG. 1, the Off-FET needs to couple upper emitter UE of PNP transistor 12 to upper base UB of PNP transistor 12 when turned on. Since the regions for upper emitter UE and upper base UB in the semiconductor wafer forming P type MCT 10 are typically located near an upper surface of the semiconductor wafer, the trench only needs to be a few microns deep. This shallow trench does not pass through the blocking junction between upper base UB for PNP transistor 12 and lower base LB for NPN transistor 14 and thus does not effect the breakdown voltage or the Miller capacitance for the P type MCT. However, unlike the Off-FET, disposing an On-FET in a trench poses problems.

Referring to FIG. 2, a P type MCT 20 with an On-FET disposed in a trench 22 as discussed above is shown to illustrate the problems of putting an On-FET in a trench. In this example, the P type MCT 20 includes a semiconductor wafer with opposing upper and lower surfaces 24 and 26. A cathode C is coupled to an N type lower emitter region 28. The N type lower emitter region in 28 rests along lower surface 26 of the wafer. A P type lower base, upper collector, and On-FET drain region (P type lower base region) 30 is located on N type lower emitter region 28 and an N+ type upper base, lower collector, and Off-FET drain region (N type upper base region) 32 is located on P type lower base region 30. A P type upper emitter region 34 is located on N type upper base region 32 with a P+ type On-FET source region 36 located on P type upper emitter region 34. A portion of the P+ type On-FET source region 36 extends to upper surface 24. A plurality on N+ type Off-FET source regions 38 are located along upper surface 24 and extend down in wells in P+ type On-FET source region 36. A dielectric layer 40 covers P+ type On-FET source region 36 and N+ type Off-FET source region. An anode (not shown) is coupled to the portions of the P+ type On-FET source region and to the N+ type Off-FET regions 38 located along upper surface 24 through openings (not shown) etched through dielectric layer 40.

As shown in FIG. 1, the On-FET 18 for P type MCT 10 needs to couple upper emitter UE to lower base LB when turned on. Accordingly, trench 22 for On-FET 18 must extend from upper surface 24 of the wafer to the P type lower base region 30. As shown in FIG. 2, the trench 22 with a bottom 42 and sidewall 44 extends into the wafer in a substantially perpendicular direction to upper surface 24 down through the N+ type Off-FET source regions 38, P+ type On-FET source region 36, P type upper emitter region 34, and N type upper base region 32, and partially into the P type lower base region 30. A gate oxide layer 46 lines bottom 42 and sidewall 44 and separates a doped polysilicon region in trench 44 from the N+ type Off-FET source, P+ type On-FET source, P type upper emitter, and N type upper base, and P type lower base regions 38, 36, 34, 32, and 30. Unfortunately, when trench 22 extends through these regions 38, 36, 34, 32, and 30, trench 22 also extends through the high voltage blocking junction 48 for MCT 20. The blocking junction 48 is located between the N type upper base region 32 and the P type lower base region 30 and holds off a voltage up to a breakdown voltage if MCT 20 is not triggered. Etching trench 22 down to the P type lower base region 30 of MCT 20 lowers the lower trench corner to lower base breakdown voltage and substantially increases the gate capacitance, particularly Miller capacitance. Additionally, each additional region which must be etched adds to the time, cost, and difficulty in manufacturing the MCT.

Accordingly, there is a need for an MCT with a trench On-FET which will enable cell density be increased without lowering the breakdown voltage, without substantially increasing Miller capacitance, or adding to the difficultly or cost of manufacturing MCTs.

SUMMARY OF INVENTION

One embodiment of a metal oxide semiconductor controlled thyristor in accordance with the present invention includes a semiconductor wafer having opposing first and second surfaces. The wafer has first through sixth sequential regions which are disposed one over each other. The first region includes the second surface of the wafer and each of the second through sixth regions has at least a portion which extends up to the first surface. The first, third, and sixth regions have a first type of conductivity and the second, fourth, and fifth regions have a second type of conductivity. A trench with a bottom and sidewalls extends from the first surface and passes through the fourth, fifth, and sixth regions and into the third region. A dielectric material coats the bottom and sidewalls of the trench and a conductive material fills the remainder of the trench.

In an alternative embodiment: the third through sixth regions have at least a portion which extends up to the first surface; the first, fourth, and sixth regions have a first type of conductivity; the second, third, and fifth regions have a second type of conductivity; and the trench extends from the first surface and passes through the fifth and sixth regions and into the fourth region.

The metal oxide semiconductor controlled thyristor (MCT) with an On-FET in a trench described above provides a number of advantages. With the invention, a greater cell density of MCTs can be achieved than in MCTs without On-FETs in trenches. The increase in cell density of MCTs is achieved without injuring the breakdown voltage or substantially increasing the gate capacitance, and in particular the Miller capacitance, because the trench does not pass through the blocking junction and is not located near the blocking junction. Since the trench for the On-FET for the MCT does not need to pass through as many regions, the MCT is easier to etch, refill, and planarize.

DETAILED DESCRIPTION

Figure 3:
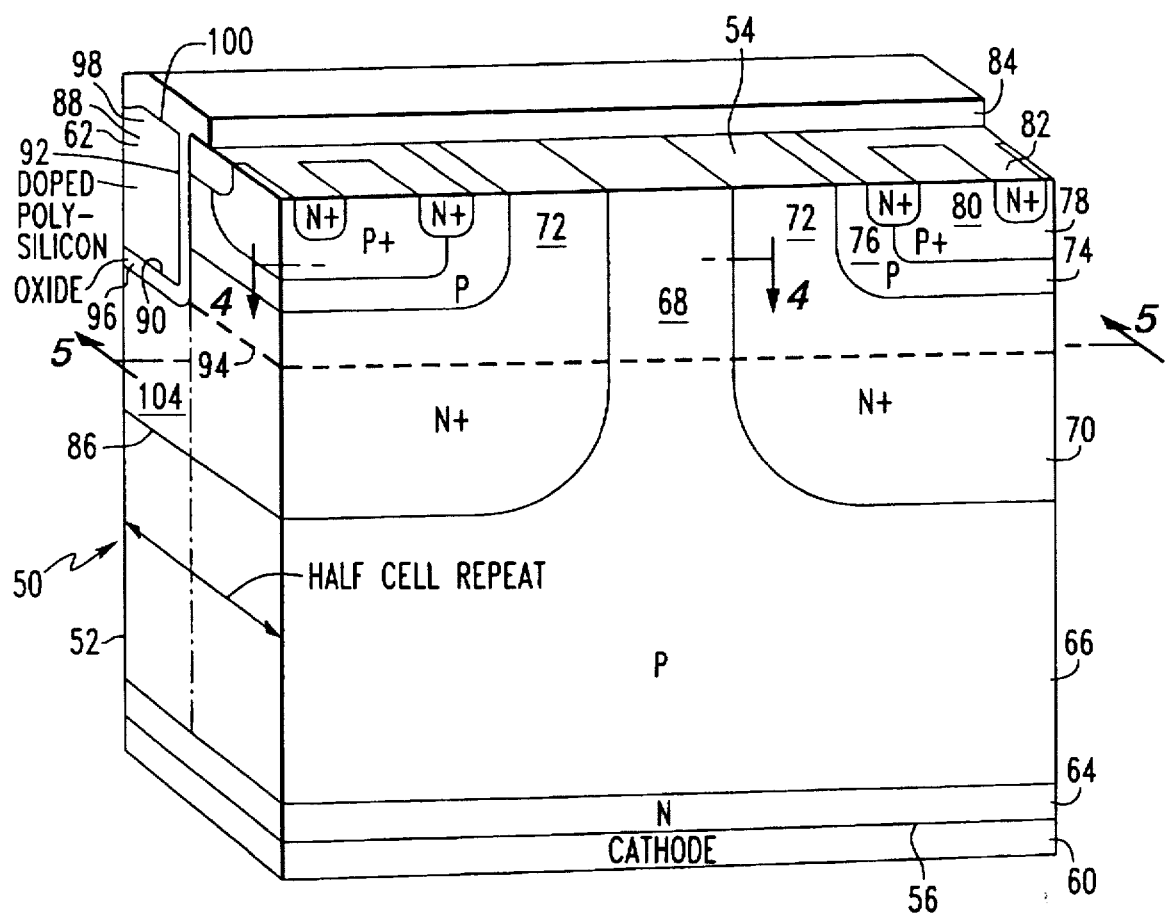
FIG. 3 is a perspective view of one embodiment of an MCT with a trench On-FET in accordance with the present invention.

One embodiment of a P type metal oxide semiconductor controlled thyristor (MCT) 50 in accordance with the present invention is illustrated in FIG. 3. MCT 50 includes an On-FET in a trench 62 which enables a greater cell density of MCTs to be obtained, then in MCTs without On-FETs in trenches, without injuring the breakdown voltage or increasing the gate capacitance, and in particular the Miller capacitance. Since the trench 62 for the On-FET for MCT 50 does not need to pass through as many regions, MCT 50 is easier to etch, refill, and planarize. Although a P type MCT 50 with an On-FET in a trench 62 is illustrated, the invention also covers other embodiments, such as a P type MCT 110 shown in FIG. 7 and an N type MCT with an On-FET in a trench.

Referring more specifically to FIG. 3, P type MCT 50 includes a semiconductor wafer 52 having opposing first and second surfaces 54 and 56. In this particular embodiment, a cathode 60 is coupled to an N type lower emitter region 64 which forms second surface 56 of wafer 52. A P type lower base, upper collector, and On-FET drain region (P type lower base region) 66 is located over N type lower emitter region 64 with a portion 66 of the P type lower base region 66 extending up to first surface 54 of wafer 52. An N type upper base, lower collector, and Off-FET drain region (N type upper base region) 70 is located over the portion of the P type lower base region 66 which is below first surface 54 and includes a portion 72 which extends to first surface 54. A P type upper emitter region 74 is located over the portion of the N type upper base region 70 which is below the first surface 54 and also includes a portion 76 which extends to first surface 54. A P+ type On-FET source region is located over the portion of the P type upper emitter region 78 which is below first surface 54 and includes a portion 80 which extends to first surface 54. A plurality of N+ type On-FET source regions 82 are exposed to first surface 54 and are located over either P+ type source On-FET region 78 or P+ type source On-FET region 78 and P upper emitter region 74. A dielectric layer 84 is located along first surface 54 over P type lower base region 66, N type upper base region 70, P type upper emitter region 74, P+ type On-FET source region 78, and N+ type Off-FET source region 82. An anode (not shown) would be coupled to the portions 76, 80, of the P type upper emitter region and the P+ type On-FET source region and also to the N+ type Off-FET source regions 82 through an opening (not shown) etched through dielectric layer 84.

A blocking junction 86 for P-type MCT 50 is located between P type lower base region 66 and N type upper base region 70. Blocking junction 86 holds off a voltage up to a breakdown voltage, if MCT 50 is not triggered.

Gate 88 is disposed in trench 62 with a bottom 90 and sidewalls 92 (only one sidewall is shown) in P type MCT 50. Trench 62 extends in a direction substantially perpendicular to first surface 54 and through N+ type Off-FET source region 82, P+ type On-FET source region 78, and P type upper emitter region 74 and into N type upper base region 70. In this particular embodiment, trench 62 extends about halfway through N type upper base region 70. Bottom 90 of trench 62 rests on a plane 94 and one of sidewalls 92 of trench 62 rests against N+ type Off-FET source region 82, P+ type On-FET source region 78, P type upper emitter region 74, and N type upper base region 70. Plane 94 is indicated by the dashed lines in FIGS. 3 and 5. Referring back to FIG. 3, trench 62 is lined with a gate oxide layer 96 or other suitable dielectric, such as silicon nitride, and is then filled with a conductive material, such as doped polysilicon 98. Although doped polysilicon is used to fill trench 62, other types of conductive material, such as metal could be used. The top 100 of trench 62 is covered by dielectric layer 84 and can be etched away to allow gate 88 in trench 62 to be coupled to other connectors.

Figures 5, 6:
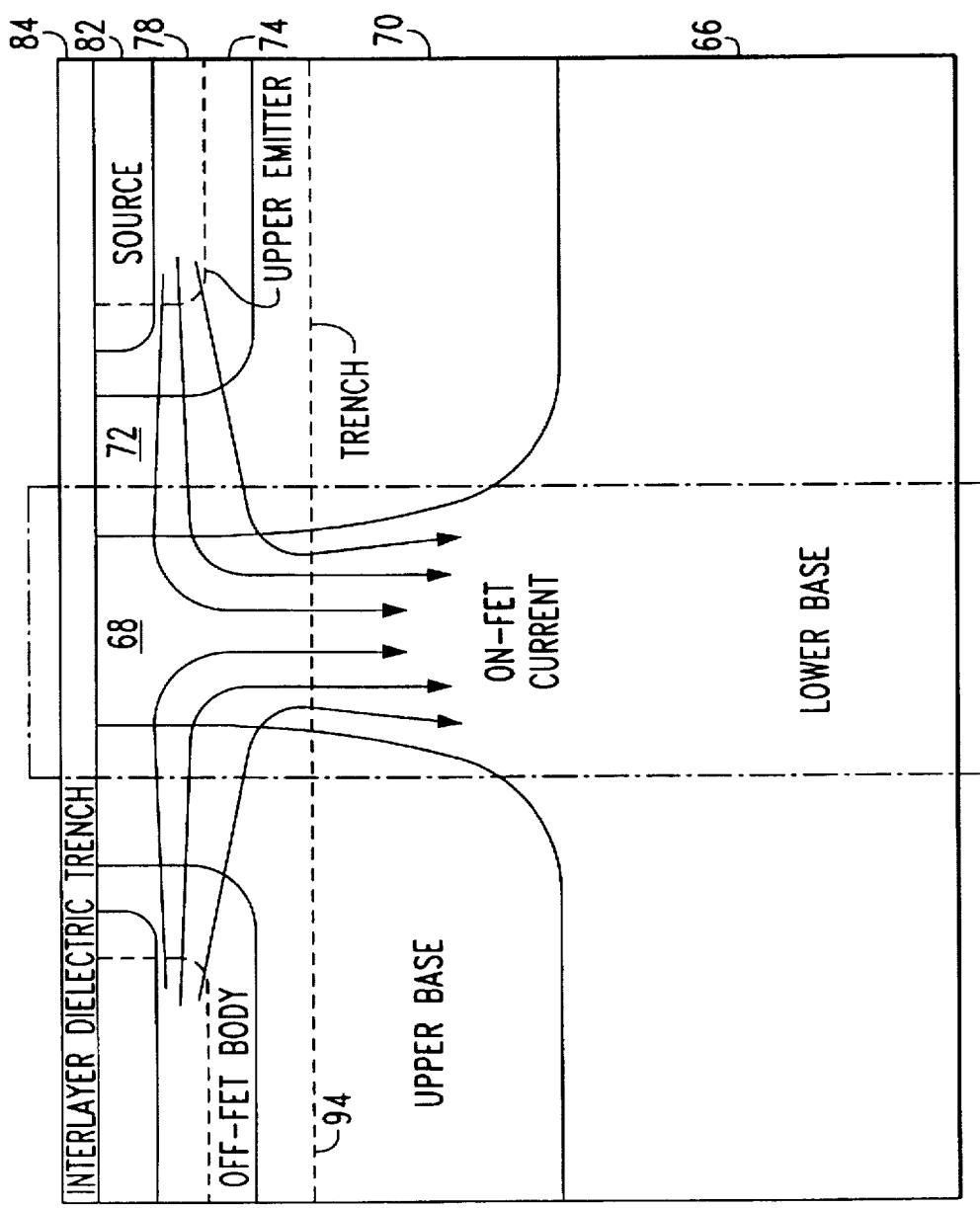
FIG. 5 is another partial, cross-sectional view of the MCT taken along line 5—5 of FIG. 3.
FIG. 6 is another embodiment for the portion of the partial, cross-sectional view of the MCT outlined with dotted lines in FIG. 5.

As shown in FIGS. 3, 5, and 6, a portion 68 of P type lower base region 66 extends up to first surface 54 of wafer 52. This portion 66 must extend above plane 94. Portion 68 above plane 94 rests against one of the sidewalls 92 of trench 62 lined with oxide layer 96 and filled with doped polysilicon 98. Although in FIG. 3 the portion 68 extends above plane 94 up to first surface 54, as shown in FIG. 6, a strip 102 of N type upper base region 70 may separate portion 68 of P type lower base region 66 from first surface 54.

By disposing the On-FET in trench 62 and extending a portion 68 of P type lower base region 66 above plane 94 a greater cell density of MCT can be obtained then with MCT's without On-FETs in trenches without the problems discussed earlier. In particular, the size of the MCT cell can be reduced from about twenty microns on each side to about five microns on each side. Additionally, with the invention trench 62 does not need to extend down to blocking junction 86 between P type lower base region 66 and N type upper base region 70. A substantial section 104 of N type upper base region 70 shields gate 88 from blocking junction 86. As a result, the breakdown voltage is not reduced and gate capacitance, and in particular Miller capacitance, is little increased. Although in this particular embodiment a vertical device is shown, the invention also applies to lateral devices.

Figure 1:
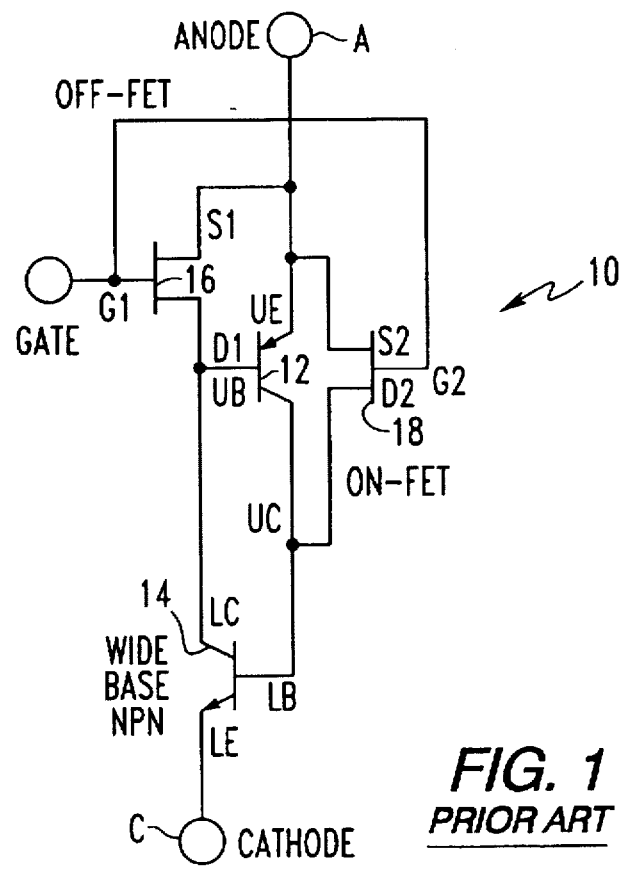
FIG. 1 is a circuit diagram of a prior art metal oxide semiconductor controlled thyristor (MCT)
Figure 4:
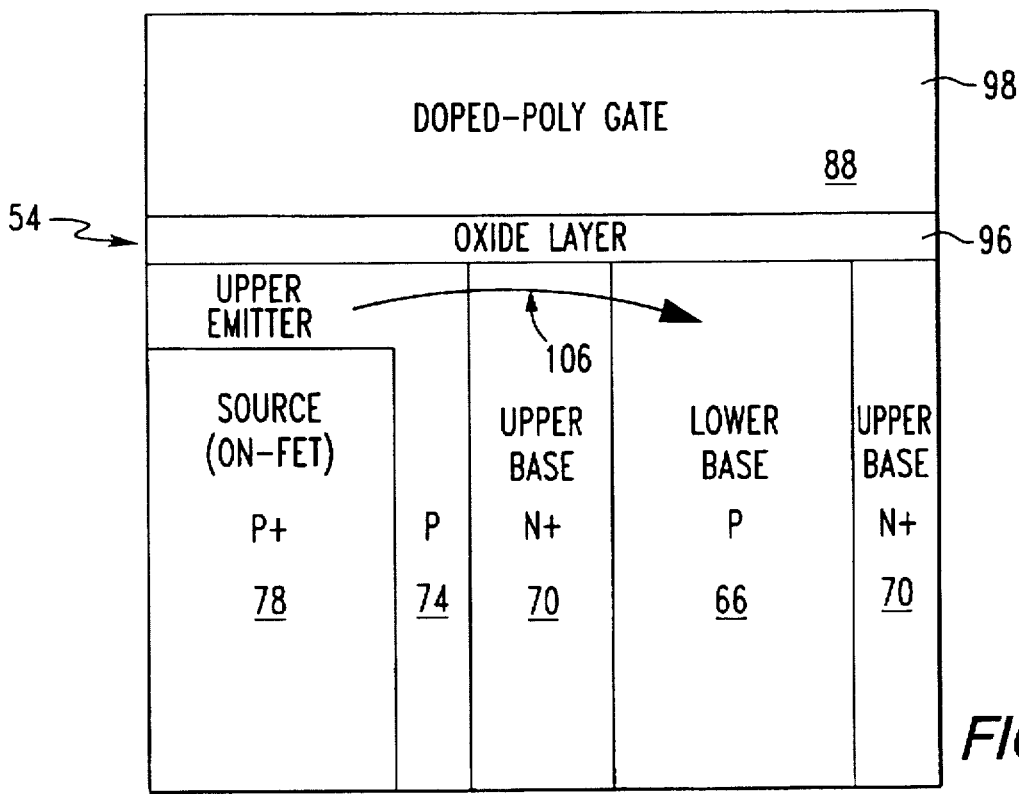
FIG. 4 is a partial, cross-sectional view of the MCT taken along line 4—4 of FIG. 3.
Figure 2:
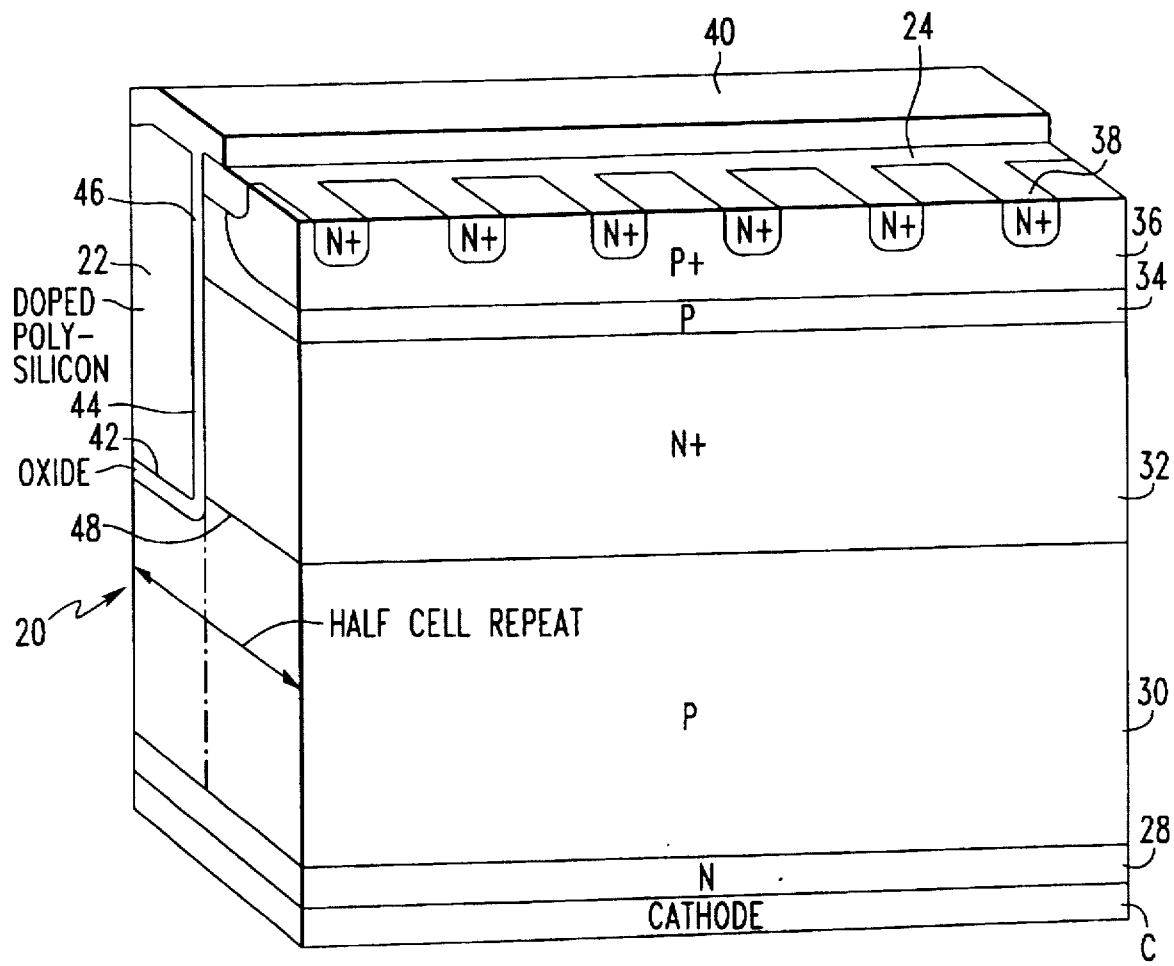
FIG. 2 is a perspective view of a prior art MCT with a trench On-Field Effect Transistor (On-FET)

Referring to FIGS. 1 and 4-5, the operation of P type MCT 50 with the On-FET in trench 62 is illustrated. As shown in FIG. 4, when a negative voltage is applied to gate 88, then electrons in N type upper base region 70 near oxide layer 96 for gate 88 are driven away providing a P channel 106 (shown by the arrow) from upper emitter region 74 and P+ type On-FET source region 78 to P type lower base region 66 along sidewall 92 of trench 62. On-FET current then flows from upper emitter region 74 and P+ type On-FET source region 78 to P type lower base region 66 in the direction of the arrows, as shown in FIGS. 4-6. As described earlier with respect to FIG. 1, when the current reaches P type lower base region 66, the current turns NPN transistor 14 on. Once NPN transistor 14 is on, the lower collector LC of NPN transistor 14 draws current from N type upper base region 70 for PNP transistor 12 turning PNP transistor 12 on and thus turning on P type MCT 50.

P type MCT 50 is turned off when a voltage more positive than the Off-FET threshold voltage is applied to gate 88. The positive voltage at gate 88, draws electrons in P type upper emitter region 74 and P+ type On-FET source region 78 towards oxide layer 96 for gate 88 to form an N channel along sidewall 92 of trench 62 between N+ type Off-FET source region 82 and N+ type Off-FET drain region 70. Off-FET current then flows from N+ type Off-FET source region 82 to N+ type Off-FET drain region 70 shorting out P type upper emitter region 74 to N type upper base region 70. As described earlier with respect to FIG. 1, when P type upper emitter region 74 is shorted out to N type upper base region 70 then PNP transistor 12 is turned off which then turns off NPN transistor 14, thus turning off P type MCT 50.

Figure 7:
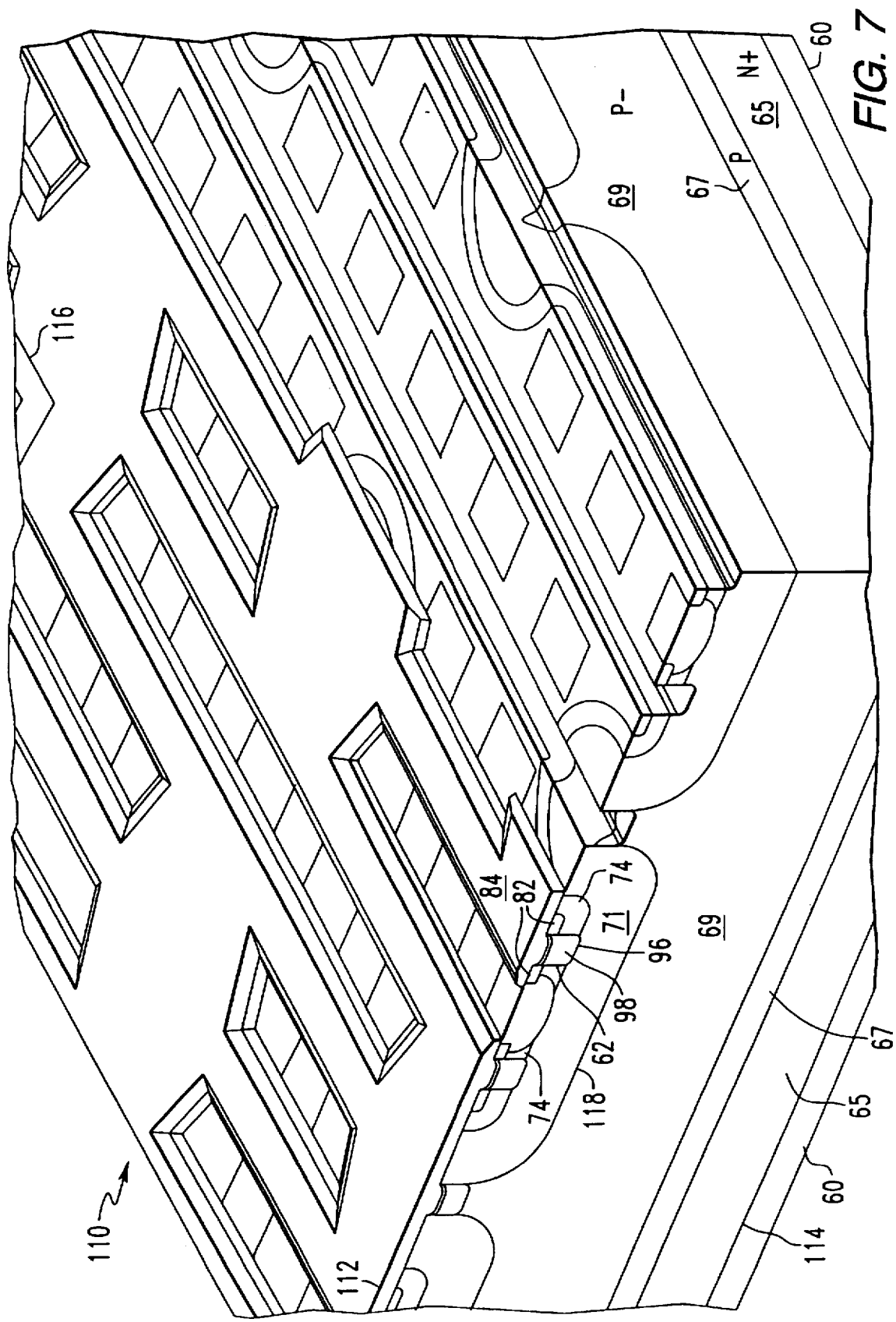
FIG. 7 is a perspective view of another embodiment of an MCT with a trench On-FET in accordance with the present invention.

Referring to FIG. 7, another embodiment for a P type MCT 110 is illustrated. Corresponding elements in FIG. 7 have numeral designations which correspond to those numeral designations used in FIGS. 3-6 and will not be described again. P type MCT 110 has opposing first and second surfaces 112 and 114. In this particular embodiment, a cathode 60 is coupled to an N+ type lower emitter region 65 which forms second surface 114. A P type region 67 is located over N+ type lower emitter region 65. A P- type lower base, upper collector, and On-FET drain region (P- type lower base region) 69 with a portion of the P- type lower base region 69 extending towards first surface 112, but not reaching first surface 112 (like the embodiment shown in FIG. 6). An N type upper base, lower collector, and On-FET drain region (N type upper base region) 71 is located over P- type lower base region 69 which is below first surface 54 and includes a portion of N type upper base region extends to first surface 112. A P type upper emitter and On-FET source region (P type upper emitter region) 74 is located over the portion of the N type upper base region 71 which is below the first surface 112 and also includes a portion which extends to first surface 112. A plurality of N+ type On-FET source regions 82 are exposed to first surface 112 and are located over P type upper emitter region 74. A dielectric layer 84 is located along first surface 112 over P- type lower base region 69, N type upper base region 71, P type upper emitter region 74, and N+ type Off-FET source region 82. An anode 116 is coupled to the portions of the P type upper emitter region 74 and also to the N+ type Off-FET source regions 82 through openings etched through dielectric layer 84.

A blocking junction 118 for P-type MCT 50 is located between P-type lower base region 69 and N type upper base region 71. Blocking junction 118 holds off a voltage up to a breakdown voltage, if MCT 110 is not triggered.

Doped polysilicon or gate 98 is disposed in trench 62 in P type MCT 110. Trench 62 extends in a direction substantially perpendicular to first surface 112 and through N+ type Off-FET source region 82. P type upper emitter region 74 and into N type upper base region 71. Trench 62 is lined with a gate oxide layer 96 or other suitable dielectric, such as silicon nitride, and is then filled with a conductive material, such as doped polysilicon 98. Although doped polysilicon is used to fill trench 62, other types of conductive material, such as metal could be used. The top of trench 62 is covered by gate oxide layer 96 and then dielectric layer 84 and can be etched away to allow doped poly silicon 98 in trench 62 to be coupled to other connectors.

The operation of P type MCT 110 with the On-FET in trench 62 is the same as P type MCT 50. When a voltage more negative than the On-FET threshold voltage is applied to doped poly silicon 98, then electrons in N type upper base region 71 near oxide layer 96 for doped poly silicon 98 are driven away providing a P channel 106 from P type upper emitter region 74 to P- type lower base region 69 along a sidewall of trench 62. On-FET current then flows from P type upper emitter region 74 to P- type lower base region 69. As described earlier with respect to FIG. 1, when the current reaches P- type lower base region 69, the current turns NPN transistor 14 on. Once NPN transistor 14 is on, the lower collector LC of NPN transistor 14 draws current from N type upper base region 71 for PNP transistor 12 turning PNP transistor 12 on and thus turning on P type MCT 110.

P type MCT 110 is turned off when a voltage more positive than the Off-FET threshold voltage is applied to doped poly silicon 98. The positive voltage draws electrons in P type upper emitter region 74 towards oxide layer 96 for doped poly silicon 98 to form an N channel along a sidewall of trench 62 between N+ type Off-FET source region 82 and N type Off-FET drain region 71. Off-FET current then flows from N+ type Off-FET source region 82 to N type Off-FET drain region 71 shorting out P type upper emitter region 74 to N type upper base region 71. As described earlier with respect to FIG. 1, when P type upper emitter region 74 is shorted out to N type upper base region 71 then PNP transistor 12 is turned off which then turns off NPN transistor 14, thus turning off P type MCT 110.

Having thus described the basic concept of the invention, it will be readily apparent to those skilled in the art that the foregoing detailed disclosure is intended to be presented by way of example only, and is not limiting. In particular, although a P type MCT is shown in the embodiments disclosed, an N type MCT can be made by changing all P type regions to N type and visa versa. Various alterations, improvements and modifications will occur and are intended to those skilled in the art, but not expressly stated herein. These modifications, alterations and improvements are intended to be suggested hereby, and within the spirit and scope of the invention. Accordingly, the invention is limited only by the following claims and equivalents thereto.

What is claimed is:

1. A metal oxide semiconductor controlled thyristor comprising:

a semiconductor wafer having opposing first and second surfaces, said wafer comprising first through sixth sequential regions which are disposed one over the other with said first region including the second surface and each of the second through sixth regions having at least a portion extending up to the first surface, wherein said first, third, and sixth regions have a first type of conductivity and said second, fourth, and fifth regions have a second type of conductivity; and a trench with a bottom and sidewalls, said trench extending from the first surface and passing through said fourth, fifth, and sixth regions and into said third region with a dielectric material coating said bottom and said sidewalls and a conductive material filling said trench.

2. The thyristor as set forth in claim 1 wherein said conductive material with said dielectric material in said trench forms a gate for an on-field effect transistor and an off-field effect transistor.

3. The thyristor as set forth in claim 1 wherein said second region is a drain region and said fifth region is a source region for said on-field effect transistor.

4. The thyristor as set forth in claim 1 wherein said third region is a drain region and said sixth region is a source region for said off-field effect transistor.

5. The thyristor as set forth in claim 1 wherein said first region is a lower emitter region, said second region is a lower base region, and said third region is a lower collector region for an NPN transistor and said second region is an upper collector region, said third region an upper base region, and said fourth region is an upper emitter region for a PNP transistor.

6. The thyristor as set forth in claim 1 wherein said first type of conductivity is N type and said second type of conductivity is P type.

7. The thyristor as set forth in claim 1 wherein said first type of conductivity is P type and said second type of conductivity is N type.

8. The thyristor as set forth in claim 1 wherein the portion of said second region extending to the first surface is covered by a strip of said third region and wherein the portion of said second region extends into said trench.

9. The thyristor as set forth in claim 1 wherein said trench extends no more than halfway through said third region.

10. A metal oxide semiconductor controlled thyristor comprising:

a semiconductor wafer having opposing first and second surfaces, said wafer comprising first through sixth sequential regions which are disposed one over the other with said first region including the second surface and each of the second through sixth regions having at least a portion extending to the first surface, wherein said first, third, and sixth regions have a first type of conductivity and said second, fourth, and fifth regions have a second type of conductivity; and a trench with a bottom and sidewalls, said trench extending from the first surface into said wafer and terminating above a blocking junction between the second region and the third region, said trench coated with a dielectric material and filled with a conductive material.

11. The thyristor as set forth in claim 10 wherein said conductive material with said dielectric material in said trench forms a gate for an on-field effect transistor and an off-field effect transistor.

12. The thyristor as set forth in claim 10 wherein said second region is a drain region and said fifth region is a source region for said on-field effect transistor.

13. The thyristor as set forth in claim 10 wherein said third region is a drain region and said sixth region is a source region for said off-field effect transistor.

14. The thyristor as set forth in claim 10 wherein said first region is a lower emitter region, said second region is a lower base region, and said third region is a lower collector region for an NPN transistor and said second region is an upper collector region, said third region an upper base region, and said fourth region is an upper emitter region for a PNP transistor.

15. The thyristor as set forth in claim 10 wherein said first type of conductivity is N type and said second type of conductivity is P type.

16. The thyristor as set forth in claim 10 wherein said first type of conductivity is P type and said second type of conductivity is N type.

17. The thyristor as set forth in claim 10 wherein the portion of said second region extending to the first surface is covered by a strip of said third region, the portion of said second region extending above the bottom of said trench.

18. The thyristor as set forth in claim 10 wherein said trench extends no more than halfway through said third region.

19. A method for manufacturing a metal oxide semiconductor controlled thyristor, said thyristor comprising a semiconductor wafer having opposing first and second surfaces, said wafer comprising first through sixth sequential regions which are disposed one above the other with said first region including the second surface and each of the second through sixth regions having at least a portion extending up to the first surface, wherein said first, third, and sixth regions have a first type of conductivity and said second, fourth, and fifth regions have a second type of conductivity, said method comprising the steps of:

etching a trench into said wafer beginning at said first surface and passing through said fourth, fifth, and sixth regions and into said third region;

coating said trench with a dielectric material; and filling said trench with a conductive material filling said trench.

20. The method as set forth in claim 19 wherein said conductive material with said dielectric material in said trench forms a gate for an on-field effect transistor and an off-field effect transistor.

21. The method as set forth in claim 20 wherein said second region is a drain region and said fifth region is a source region for said on-field effect transistor.

22. The method as set forth in claim 21 wherein said third region is a drain region and said sixth region is a source region for said off-field effect transistor.

23. The method as set forth in claim 22 wherein said first region is a lower emitter region, said second region is a lower base region, and said third region is a lower collector region for an NPN transistor and said second region is an upper collector region, said third region an upper base region, and said fourth region is an upper emitter region for a PNP transistor.

24. The method as set forth in claim 19 wherein said first type of conductivity is N type and said second type of conductivity is P type.

25. The method as set forth in claim 19 wherein said first type of conductivity is P type and said second type of conductivity is N type.

26. The method as set forth in claim 19 wherein the portion of said second region extending to the first surface is covered by a strip of said third region, the portion of said second region extending above the bottom of said trench.

27. A metal oxide semiconductor controlled thyristor comprising:

a semiconductor wafer having opposing first and second surfaces, said wafer comprising first through sixth sequential regions which are disposed one over the other with said first region including the second surface and each of the third through sixth regions having at least a portion extending up to the first surface, wherein said first, fourth, and sixth regions have a first type of conductivity and said second, third, and fifth regions have a second type of conductivity; and a trench with a bottom and sidewalls, said trench extending from the first surface and passing through said fifth and sixth regions and into said fourth region with a dielectric material coating said bottom and said sidewalls and a conductive material filling said trench.

28. The thyristor as set forth in claim 27 wherein said conductive material with said dielectric material in said trench forms a gate for an on-field effect transistor and an off-field effect transistor.

29. The thyristor as set forth in claim 27 wherein said third region is a drain region and said fifth region is a source region for said on-field effect transistor.

30. The thyristor as set forth in claim 27 wherein said fourth region is a drain region and said sixth region is a source region for said off-field effect transistor.

31. The thyristor as set forth in claim 27 wherein said first region is a lower emitter region, said third region is a lower base region, and said fourth region is a lower collector region for an NPN transistor and said third region is an upper collector region, said fourth region an upper base region, and said fifth region is an upper emitter region for a PNP transistor.

32. The thyristor as set forth in claim 27 wherein said first type of conductivity is N type and said second type of conductivity is P type.

33. The thyristor as set forth in claim 27 wherein said first type of conductivity is P type and said second type of conductivity is N type.

34. The thyristor as set forth in claim 27 wherein the portion of said third region extending to the first surface is covered by a strip of said fourth region and wherein the portion of said third region extends into said trench.

35. The thyristor as set forth in claim 27 wherein said trench extends no more than halfway through said fourth region.

36. A metal oxide semiconductor controlled thyristor comprising:

a semiconductor wafer having opposing first and second surfaces, said wafer comprising first through sixth sequential regions which are disposed one over the other with said first region including the second surface and each of the third through sixth regions having at least a portion extending to the first surface, wherein said first, fourth, and sixth regions have a first type of conductivity and said second, third, and fifth regions have a second type of conductivity; and a trench with a bottom and sidewalls, said trench extending from the first surface into said wafer and terminating above a blocking junction between the third region and the fourth region, said trench coated with a dielectric material and filled with a conductive material.

37. The thyristor as set forth in claim 36 wherein said conductive material with said dielectric material in said trench forms a gate for an on-field effect transistor and an off-field effect transistor.

38. The thyristor as set forth in claim 36 wherein said third region is a drain region and said fifth region is a source region for said on-field effect transistor.

39. The thyristor as set forth in claim 36 wherein said fourth region is a drain region and said sixth region is a source region for said off-field effect transistor.

40. The thyristor as set forth in claim 36 wherein said first region is a lower emitter region, said third region is a lower base region, and said fourth region is a lower collector region for an NPN transistor and said third region is an upper collector region, said fourth region an upper base region, and said fifth region is an upper emitter region for a PNP transistor.

41. The thyristor as set forth in claim 36 wherein said first type of conductivity is N type and said second type of conductivity is P type.

42. The thyristor as set forth in claim 36 wherein said first type of conductivity is P type and said second type of conductivity is N type.

43. The thyristor as set forth in claim 36 wherein the portion of said third region extending to the first surface is covered by a strip of said fourth region and wherein the portion of said third region extends into said trench.

44. The thyristor as set forth in claim 36 wherein said trench extends no more than halfway through said fourth region.

45. A method for manufacturing a metal oxide semiconductor controlled thyristor, said thyristor comprising a semiconductor wafer having opposing first and second surfaces, said wafer comprising first through sixth sequential regions which are disposed one above the other with said first region including the second surface and each of the third through sixth regions having at least a portion extending up to the first surface, wherein said first, fourth, and sixth regions have a first type of conductivity and said second, third, and fifth regions have a second type of conductivity, said method comprising the steps of:

etching a trench into said wafer beginning at said first surface and passing through said fifth and sixth regions and into said fourth region;

coating said trench with a dielectric material; and filling said trench with a conductive material filling said trench.

46. The method as set forth in claim 45 wherein said conductive material with said dielectric material in said trench forms a gate for an on-field effect transistor and an off-field effect transistor.

47. The method as set forth in claim 45 wherein said conductive material with said dielectric material in said trench forms a gate for an on-field effect transistor and an off-field effect transistor.

48. The method as set forth in claim 45 wherein said third region is a drain region and said fifth region is a source region for said on-field effect transistor.

49. The method as set forth in claim 45 wherein said fourth region is a drain region and said sixth region is a source region for said off-field effect transistor.

50. The method as set forth in claim 45 wherein said first region is a lower emitter region, said third region is a lower base region, and said fourth region is a lower collector region for an NPN transistor and said third region is an upper collector region, said fourth region an upper base region, and said fifth region is an upper emitter region for a PNP transistor.

51. The method as set forth in claim 45 wherein said first type of conductivity is N type and said second type of conductivity is P type.

52. The method as set forth in claim 45 wherein said first type of conductivity is P type and said second type of conductivity is N type.

53. The method as set forth in claim 45 wherein the portion of said third region extending to the first surface is covered by a strip of said fourth region and wherein the portion of said third region extends into said trench.

54. The method as set forth in claim 45 wherein said trench extends no more than halfway through said fourth region.

* * * * *